(12) United States Patent
Yu et al.

(10) Patent No.: US 11,621,635 B2
(45) Date of Patent: Apr. 4, 2023

(54) POWER CONVERTER IN PEAK CURRENT MODE CONSTANT-OFF TIME CONTROL

(71) Applicant: Renesas Electronics America Inc., Milpitas, CA (US)

(72) Inventors: Long Yu, Hangzhou (CN); Jin Yang, Shanghai (CN); Jianhua Yang, Suzhou (CN); Pengcheng Tang, Suzhou (CN); Xiaodong Zhan, Nanjing (CN)

(73) Assignee: Renesas Electronics America, Inc., Milpitas, CA (US)

( * ) Notice: Subject to any disclaimer, the term of this patent is extended or adjusted under 35 U.S.C. 154(b) by 96 days.

(21) Appl. No.: 17/371,785

(22) Filed: Jul. 9, 2021

(65) Prior Publication Data
US 2022/0407418 A1   Dec. 22, 2022

(30) Foreign Application Priority Data
Jun. 16, 2021 (CN) .......................... 202110664905.9

(51) Int. Cl.
| | |
|---|---|
| *H02M 3/157* | (2006.01) |
| *H02M 3/158* | (2006.01) |
| *H03K 19/20* | (2006.01) |
| *H03K 3/017* | (2006.01) |
| *H02M 1/00* | (2006.01) |

(52) U.S. Cl.
CPC ......... *H02M 3/158* (2013.01); *H02M 1/0009* (2021.05); *H02M 3/157* (2013.01); *H03K 3/017* (2013.01); *H03K 19/20* (2013.01)

(58) Field of Classification Search
CPC ...... H02M 3/158; H02M 3/157; H03K 3/017; H03K 19/20
See application file for complete search history.

(56) References Cited

U.S. PATENT DOCUMENTS

| | | | |
|---|---|---|---|
| 9,270,176 B1* | 2/2016 | Nguyen | H02M 3/156 |
| 2014/0159689 A1* | 6/2014 | Chen | H02M 3/156 |
| | | | 323/282 |
| 2015/0188433 A1* | 7/2015 | Jiang | H02M 3/158 |
| | | | 323/271 |
| 2017/0338738 A1* | 11/2017 | Sun | H02M 3/156 |
| 2022/0368225 A1* | 11/2022 | Zhou | H02M 3/157 |

* cited by examiner

*Primary Examiner* — Alex Torres-Rivera
(74) *Attorney, Agent, or Firm* — Scully, Scott, Murphy & Presser, P.C.

(57) ABSTRACT

Methods and apparatuses for regulating a power converter are described. A device comprising a control circuit and a logic circuit can be integrated in a controller coupled to the power converter. The control circuit can generate a constant off-time signal based on a ramp signal and an error signal. The logic circuit can generate a control signal based on the constant off-time signal and a constant on-time signal. The logic circuit can output the control signal to the power converter. In response to an on-time period of the constant off-time signal being less than an on-time period of the constant on-time signal, the control signal can vary according to the constant on-time signal. In response to the on-time period of the constant off-time signal being greater than the on-time period of the constant on-time signal, the control signal can vary according to the constant off-time signal.

20 Claims, 11 Drawing Sheets

POWER CONVERTER IN PEAK CURRENT MODE CONSTANT-OFF TIME CONTROL

CROSS-REFERENCE TO RELATED APPLICATION

This application claims priority to Chinese Patent Application No. 202110664905.9, filed on Jun. 16, 2021, the contents of which are incorporated by this reference.

BACKGROUND

The present disclosure relates in general to apparatus, devices, and methods that can increase a duty cycle of a power converter by switching control modes, in particular, switching from valley current control mode to peak current control mode by introducing a constant off-time control mode.

In some examples, high frequency (e.g., in the megahertz range) applications may require a relatively high input voltage to keep an output voltage of a power converter in regulation. A controller can implement a constant on-time control mode to regulate the power converter. The constant on-time control mode may require a minimum-off time signal to stabilize the operation of the power converter. However, the minimum-off time signal may limit a duty cycle of the power converter, and maximum duty cycle (e.g., 100%) cannot be achieved.

SUMMARY

In some examples, a device for increasing a duty cycle of a power converter is generally described. The device can include a control circuit and a logic circuit. The control circuit can be configured to generate a constant off-time signal based on a ramp signal and an error signal. The ramp signal can be sampled from an inductor current sensed from a power converter. The error signal can be based on a feedback of an output the power converter. The logic circuit can be coupled to the control circuit and the power converter. The logic circuit can be configured to generate a control signal based on the constant off-time signal and a constant on-time signal. The logic circuit can be further configured to output the control signal to the power converter to operate the power converter. In response to an on-time period of the constant off-time signal being less than an on-time period of the constant on-time signal, the control signal can vary according to the constant on-time signal. In response to the on-time period of the constant off-time signal being greater than the on-time period of the constant on-time signal, the control signal can vary according to the constant off-time signal.

In some examples, an apparatus for increasing a duty cycle of a power converter is generally described. The apparatus can include a power converter and a controller coupled to the power converter. The controller can be configured to generate a constant off-time signal based on a ramp signal and an error signal. The ramp signal can be sampled from an inductor current sensed from the power converter, and the error signal can be based on a feedback of an output the power converter. The controller can be further configured to generate a control signal based on the constant off-time signal and a constant on-time signal. The controller can be further configured to output the control signal to the power converter to operate the power converter. In response to an on-time period of the constant off-time signal being less than an on-time period of the constant on-time signal, the control signal can vary according to the constant on-time signal. In response to the on-time period of the constant off-time signal being greater than the on-time period of the constant on-time signal, the control signal can vary according to the constant off-time signal.

In some examples, a method for increasing a duty cycle of a power converter is generally described. The method can include generating a constant off-time signal based on a ramp signal and an error signal. The ramp signal can be sampled from an inductor current sensed from a power converter, and the error signal can be based on a feedback of an output of the power converter. The method can further include generating a control signal based on the constant off-time signal and a constant on-time signal. The method can further include outputting the control signal to the power converter to operate the power converter. In response to an on-time period of the constant off-time signal being less than an on-time period of the constant on-time signal, the control signal can vary according to the constant on-time signal. In response to the on-time period of the constant off-time signal being greater than the on-time period of the constant on-time signal, the control signal can vary according to the constant off-time signal. A duty cycle of the power converter can increase in response to the control signal varying according to the constant off-time signal.

Further features as well as the structure and operation of various embodiments are described in detail below with reference to the accompanying drawings. In the drawings, like reference numbers indicate identical or functionally similar elements.

DETAILED DESCRIPTION

Figure 1:
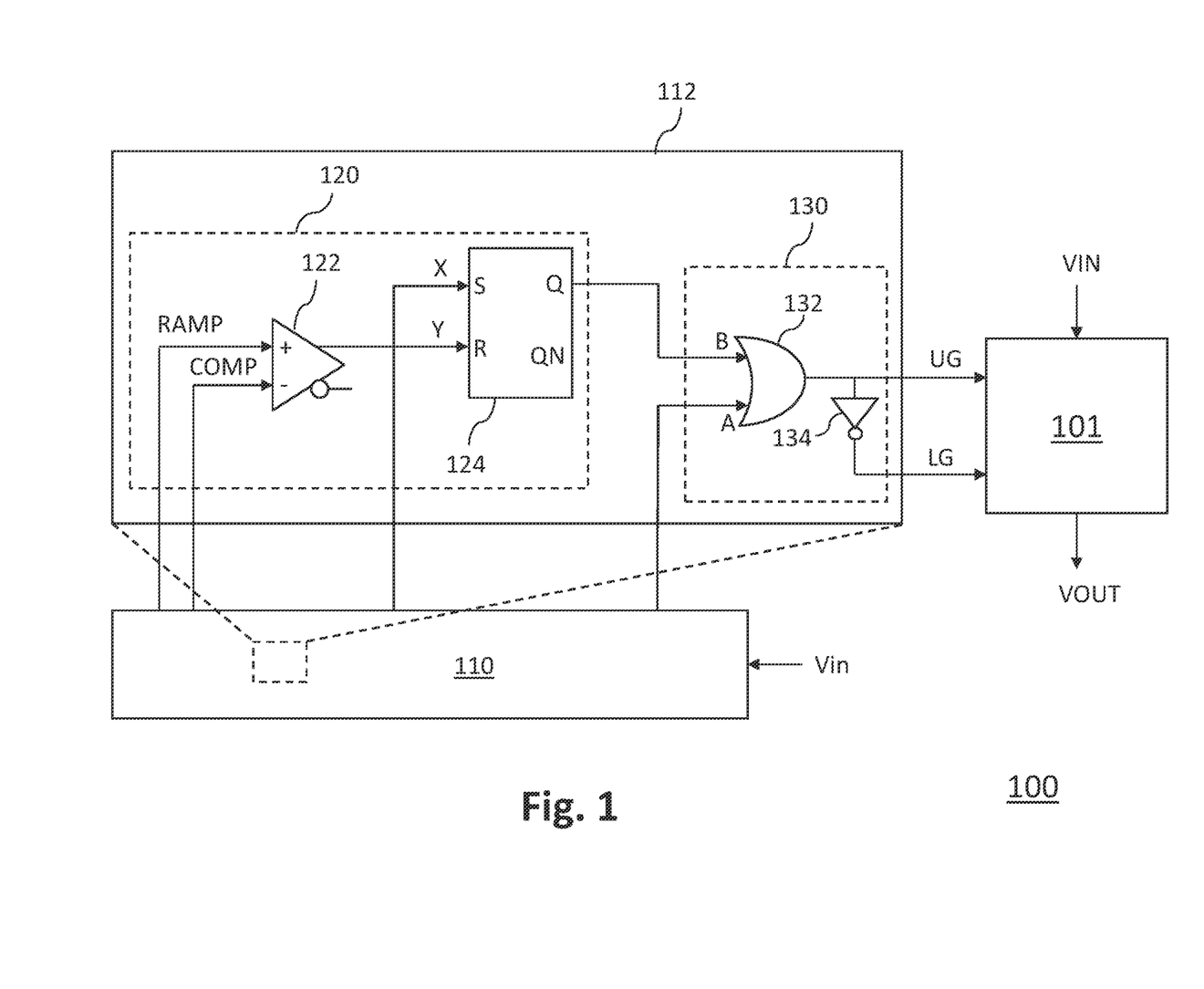
FIG. 1 is a diagram showing an example apparatus that can implement a power converter in peak current mode constant off-time control in one embodiment.

FIG. 1 is a diagram showing an example apparatus 100 that can implement a power converter in peak current mode constant OFF time control in one embodiment. The apparatus 100 can include a controller 110 and a power converter 101. The controller 110 can be coupled to the power converter 101. The controller 110 can be configured to control or regulate the operations of the power converter 101. In an example, the power converter 101 can be a DC-to-DC power converter configured to convert a source of direct current (DC) from one voltage level (e.g., VIN) to another voltage level (e.g., VOUT). In an example embodiment, the power converter 101 can be a buck converter or step-down converter configured to step down voltage (while stepping up current) from the input voltage VIN to the output voltage VOUT. The output voltage VOUT can be applied to a load. In the example shown in FIG. 1, the controller 110 can include a device 112 that can be configured to switch between different operation modes (e.g., between valley current mode and peak current mode) of the power converter 101 in order to increase a duty cycle of the power converter 101.

The device 112 can include a control circuit 120 and a logic circuit 130. In an example, the device 112 can be embedded or integrated in the controller 110. The control circuit 120 can be configured to generate a timing control signal labeled as B in FIG. 1. The signal B can be, for example, a constant off-time control signal (e.g., timing control signal that has a constant off time period which is logical low in each switching cycle). The control circuit 120 can include a comparator 122 and an SR latch 124. In an example, the comparator 122 can be a difference amplifier. The comparator 122 can receive a ramp signal (labeled as RAMP) and an error signal (labeled as COMP) as inputs. The RAMP signal can be, for example, a sample of an inductor current flowing in the power converter 101, where this inductor current can be sensed and provided by a current sampling circuit residing in the controller 110. The COMP signal can be, for example, an error signal based on the difference between a feedback signal of the output voltage VOUT being outputted by the power converter 101 and a reference signal. The COMP signal can be provided to the comparator 122 through a compensation circuit that may reside in the controller 110.

The comparator 122 can output a signal labeled as Y to the SR latch 124. The signal Y can be a differential output indicating a comparison result of the RAMP and COMP signals. The SR latch 124 can receive another signal, labeled as X, from another component of the controller 110. In an example, the signal X can be a signal resulting from a logical conjunction (e.g., logical AND operation) of a minimum-off time control signal and another signal indicating another comparison result of the RAMP and COMP signals. The SR latch 124 can output the signal B, which can be a constant off-time control signal, to the logic circuit 130. In an example, the signal Y can act as an on time control signal that can drive the control signal B LOW (e.g., logical low) to terminate the on period of the switching cycle, and the signal X can act as an off time control signal that can drive the signal B HIGH (e.g., logical high) to terminate the off period of the switching cycle. In an example, the signal X can drive the signal B HIGH in response to the COMP signal being greater than the RAMP signal.

In the example shown in FIG. 1, the logic circuit 130 can include an OR gate 132 and an inverter 134. The OR gate 132 can receive the signal B as a first input, and can receive another signal A as a second input. The control signal A can be, for example, a constant on-time control signal (e.g., timing control signal that has a constant on time period which is logical high in each switching cycle). The OR gate 132 can output a logical disjunction (e.g., OR operation output) of the signals A and B as a control signal UG. The control signal UG can be inputted into the inverter 134. The inverter 134 can invert the control signal UG to facilitate an output of another control signal LG. The control signals UG and LG can be provided to the power converter 101. The control signal UG can be used for switching a first switching element of the power converter 101 on or off, and the control signal LG can be used for switching a second switching element of the power converter 101 on or off. The first and second switching elements can be field-effect transistors (FET). The first switching element can be an upper FET (e.g., Q1 in FIG. 2B) of a buck converter (e.g., the power converter 101), and the second switching element can be a lower FET (e.g., Q2 in FIG. 2B) of the buck converter. Thus, the controller 110 or the device 112 can use the control signals UG and LG to operate the power converter 101.

An on-time period of the control signal UG can vary with the signal A or the signal B, depending on the on-time periods of the signals A and B. An on-time period can be, for example, a duration of time where a signal remains on logical high. In the example shown in FIG. 1, in response to an on-time period of the signal B being less than an on-time period of the signal A, the control signal UG can vary with the signal A. In response to the on-time period of the signal B being greater than the on-time period of the signal A, the control signal UG can vary with the signal B. In other words, the control signal UG varies with the signal having the longer on-time period among the signals A and B.

In an example, in response to the control signal UG varying with the signal A, the controller 110 can operate the power converter 101 in a valley current mode. In response to the control signal UG varying with the signal B, the controller 110 can operate the power converter 101 in a peak current mode. By switching from the valley current mode to the peak current mode, the duty cycle of the signal UG can be increased, where this increase can be up to 100% duty cycle (e.g., maximum duty cycle).

Figure 2A:
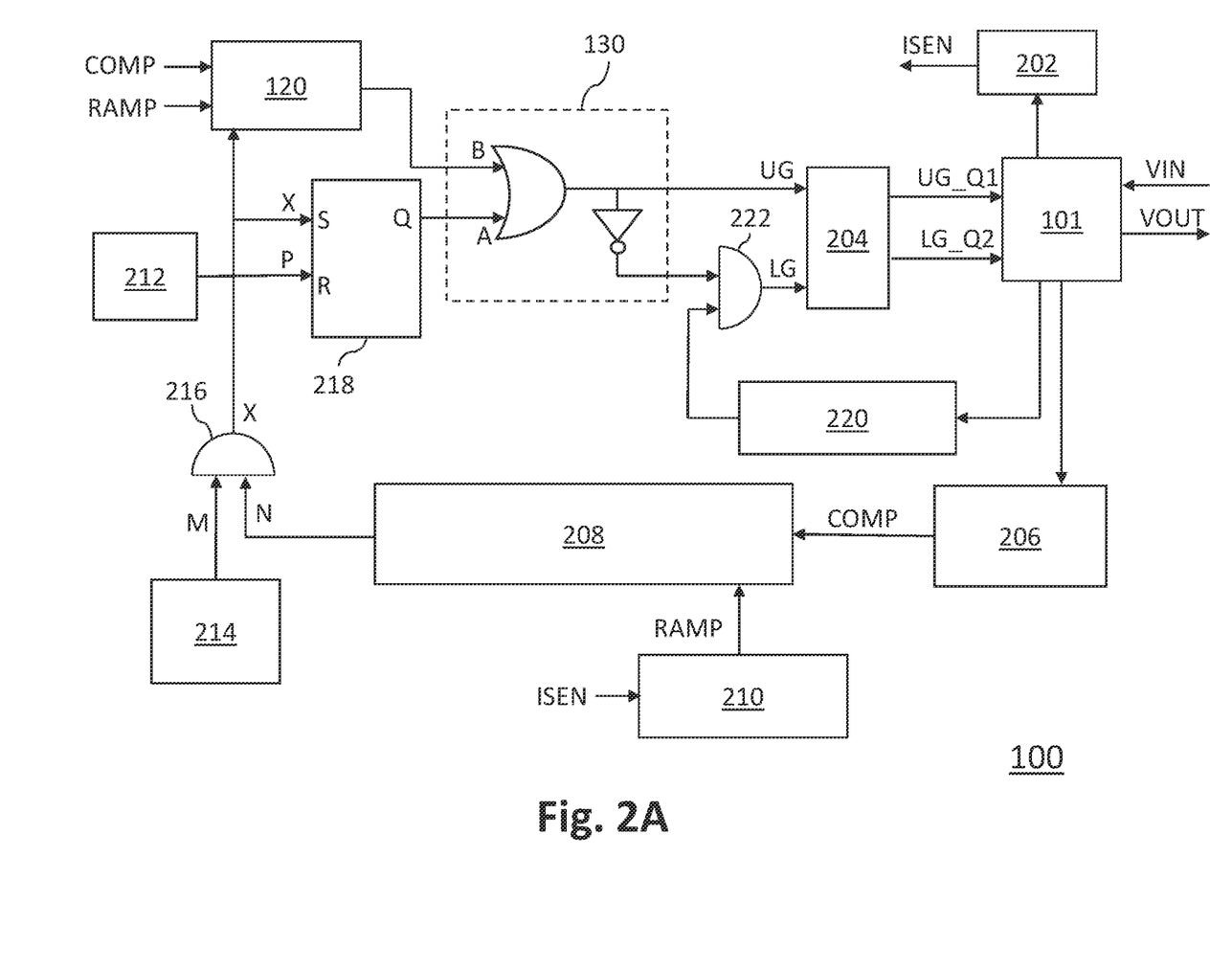
FIG. 2A is a diagram showing additional details of the example apparatus of FIG. 1 in one embodiment.

FIG. 2A is a diagram showing additional details of the example apparatus 100 of FIG. 1 in one embodiment. The apparatus 100 can further include a current sensing circuit 202, a driver 204, an error amplifier 206, a comparator circuit 208, a current sampling circuit 210, an on-time generator 212, and a minimum-off time generator 214. In the example shown in FIG. 2A, the control circuit 120, the logic circuit 130, the current sensing circuit 202, the driver 204, the error amplifier circuit 206, the comparator circuit 208, the current sampling circuit 210, the on-time generator 212, and the minimum-off time generator 214 can be components embedded or integrated in the controller 110 shown in FIG. 1. In an example embodiment, the current sensing circuit 202, the driver 204, the error amplifier circuit 206, the comparator circuit 208, the current sampling circuit 210, the on-time generator 212, and the minimum-off time generator 214 can be components of an existing controller, and the control circuit 120 and the logic circuit 130 (collectively the device 112 in FIG. 1) can be added to the existing controller to form the apparatus 100.

The sensing circuit 202 can be configured to detect or sense an inductor current flowing in the power converter 101. The sensed current ISEN can be provided by the sensing circuit 202 to the current sampling circuit 210. The current sampling circuit 210 can be configured to generate the RAMP signal based on the sensed current ISEN. The error amplifier circuit 206 can be configured to generate the COMP signal based on a feedback of the output voltage VOUT being outputted by the power converter 101. The error amplifier circuit 206 can provided the COMP signal to the comparator circuit 208. The comparator circuit 208 can be configured to compare the COMP signal received from the error amplifier circuit 206 with the RAMP signal received from the current sampling circuit 210. The COMP signal and the RAMP signal can also be sent to the control circuit 120.

Figure 2B:
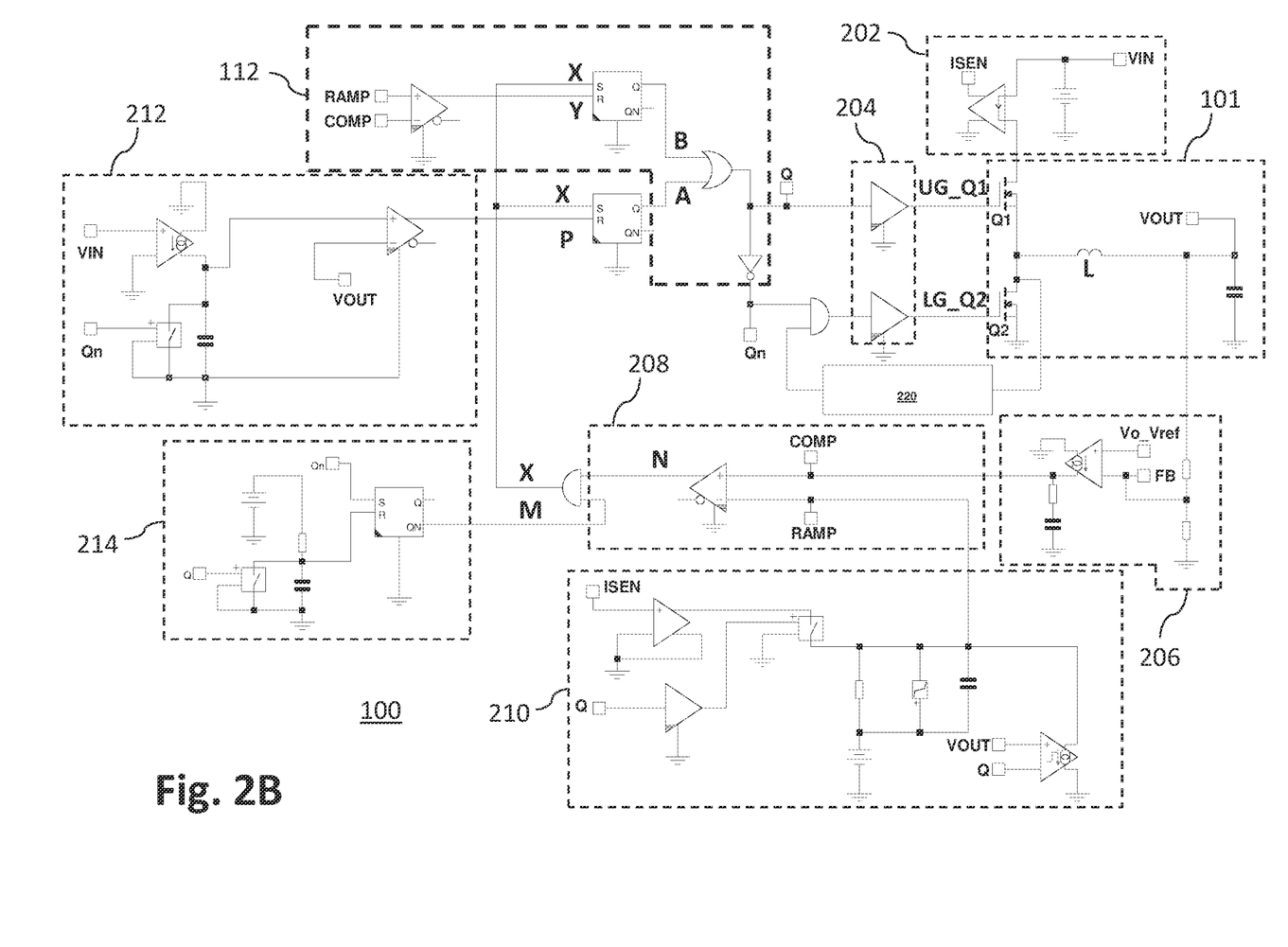
FIG. 2B is a diagram showing additional details of the example apparatus of FIG. 1 in one embodiment.

The comparator circuit 208 can output a comparison result between the COMP and RAMP signal as a signal N. Note that the signal N and the signal Y shown in FIG. 1 can be different even though both signals N and Y resulted in comparisons between the COMP and RAMP signal. For example, FIG. 2B is a diagram showing additional details of the example apparatus 100 in one embodiment. A comparator in the comparator circuit 208 can receive the COMP signal at a positive input pin, and can receive the RAMP signal at a negative input pin. Returning to FIG. 1, the comparator 122 in the control circuit 120 can receive the RAMP signal at a positive input pin, and can receive the COMP signal at a negative input pin. Therefore, the signals N and Y can be different compared signals resulting from different comparisons of the COMP and RAMP signal.

The minimum-off time generator 214 can generate a minimum-off time control signal M. The signals M and N can be inputted into an AND gate 216. The AND gate 216 can output the signal X, where the signal X can be a logical conjunction (e.g., logical AND operation) of the signals M and N. The signal X can be outputted to the control circuit 120 and a SR latch 218. The on-time generator 212 can be configured to generate a signal P, and can output the signal P to the SR latch 218. In an example, the signal P outputted from the on-time generator 212 can be an on-time control signal that can control an on-time period of the signal A. The signal N outputted from the comparator circuit 208 can be an off-time control signal that can control an off-time period (e.g., a duration of time where a signal remains on logical low) of the signals A and B. The signal M outputted from the minimum-off time generator 214 can be a minimum-off time control signal, and can be set to a uniform pulse width or duration across multiple cycles.

The control circuit 120 can be configured to generate the timing control signal B based on the signal X and the signal Y (shown in FIG. 1). The control circuit 120 can output the signal B to the logic circuit 130. The SR latch 218 can output the signal A to the logic circuit 130. In an example, the signal P can act as an on time control signal that can terminate the on period of the switching cycle and drive the control signal A LOW, and the signal X can act as an off time control signal that can terminate the off period of the switching cycle and drive the signal A HIGH. In an example, the signal X can drive the signal A HIGH in response to the COMP signal being greater than the RAMP signal. The logic circuit 130 can output the control signal UG to the power converter 101 through the driver 204, as a control signal UG_Q1. In some examples, the apparatus 100 can include a circuit 220 connected between the second switching element (e.g., the switching element being controlled by the control signal LG_Q2) of the power converter 101 and an AND gate 222. The circuit 220 can be a cross zero detection circuit of the second switching element for its diode emulation.

Figure 3A:
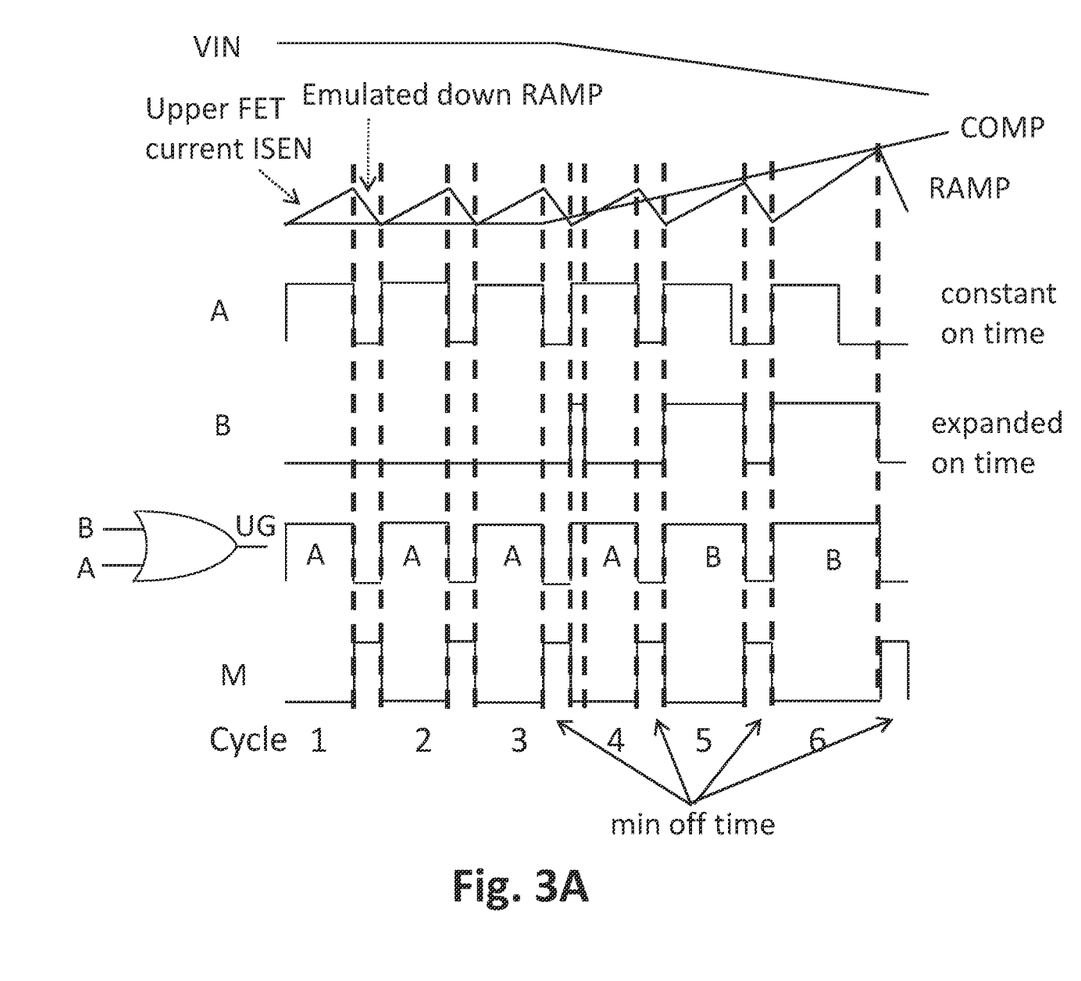
FIG. 3A is a diagram showing a set of signals and waveforms resulting from an implementation of the example apparatus of FIG. 1 in one embodiment.

FIG. 3A is a diagram showing a set of signals and waveforms resulting from an implementation of the example apparatus 100 (shown in FIG. 1-FIG. 2B) in one embodiment. The example shown in FIG. 3A shows the input voltage VIN, the COMP signal, the RAMP signal, the signal A, the signal B, the control signal UG, and the signal M (min off time), across six cycles (labeled as cycles 1, 2, 3, 4, 5, 6). The RAMP signal can be sampled from the sensed current ISEN detected from the upper FET (e.g., Q1 in FIG. 2B) of the power converter 101 (shown in FIG. 1-FIG. 2B). In response to the control signal UG being HIGH, which indicates that the upper switching element or FET of the buck converter is closed, the sensed current ISEN increases and the RAMP signal increases as well. In response to the control signal UG being LOW, the RAMP signal decreases, indicating that an inductor in the buck converter is discharging. The controller 110 (shown in FIG. 1-FIG. 2B) can be operating the power converter 101 using valley current mode control in cycles 1 to 4, and can be operating the power converter 101 using peak current mode control in cycles 5 and 6.

In cycles 1 to 4, in response to the on-period of the signal A being greater than the on-period of the signal B, the control signal UG follows or varies according to the signal A (the signal A takes control). Note that the signal B is driven to HIGH in response to the COMP signal being greater than the RAMP signal while both the COMP and RAMP signals are increasing. In response to the RAMP signal becomes greater than the COMP signal, the signal B becomes LOW again. In cycles 5 and 6, in response to the on-period of the signal A being less than the on-period of the signal B, the control signal UG follows or varies according to the signal B (the signal B takes control). The signal B is driven to HIGH in response to the COMP signal being greater than the RAMP signal while both the COMP and RAMP signals are increasing.

Figure 3B:
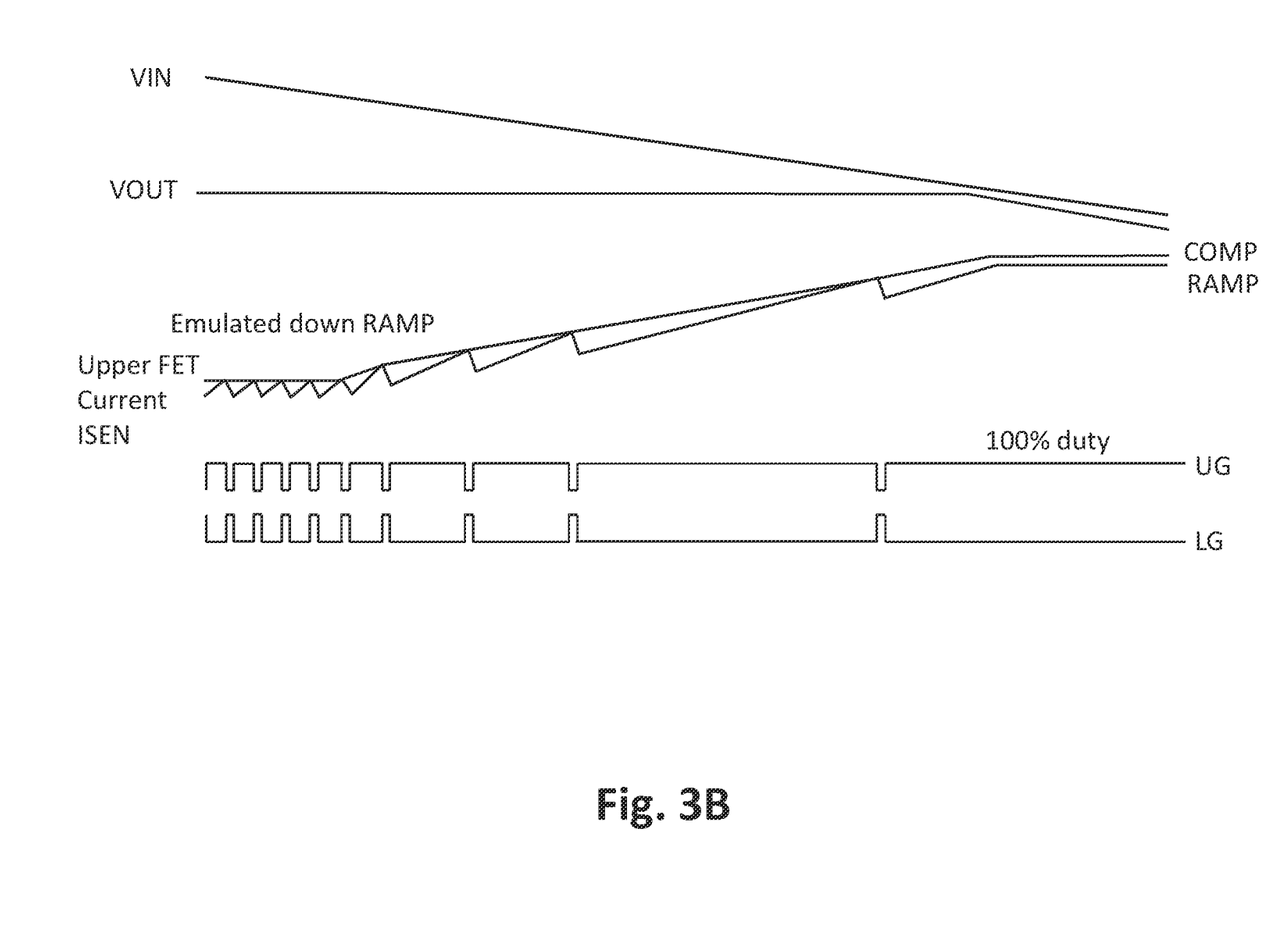
FIG. 3B is a diagram showing another set of signals and waveforms resulting from an implementation of the example apparatus of FIG. 1 in one embodiment.

In an example, if the signal B remains LOW, the control signal UG can vary according to the signal A, resulting in limiting the power converter 101 to limited and uniform duty cycle (e.g., indicated by pulse widths of the control signal UG) over time. By incorporating the device 112 having the control circuit 120 and the logic circuit 130 to generate the signal B and driving the signal B HIGH in response to the COMP signal being greater than the RAMP signal, the duty cycle can be increased. For example, as the example in FIG. 3A progress from cycle 1 to cycle 6, the pulse width of the control signal UG increases, indicating an increase in the duty cycle. In another example shown in FIG. 3B, as the difference between the input voltage VIN and the output voltage VOUT decreases, the duty cycle of the power converter 101 can increase and achieve 100% duty cycle. Note that in response to achieving 100% duty cycle, the off-time period of the signal B (which controls the control signal UG) can be reduced to the signal M (e.g., minimum-off time). Further, in an example where the input voltage VIN becomes equivalent to the output voltage VOUT, the COMP signal saturates and the RAMP signal can no longer reach COMP signal to turn off the control signal UG (or drive the control signal UG LOW), causing the power converter 101 to run at 100% duty cycle.

Figure 4A:
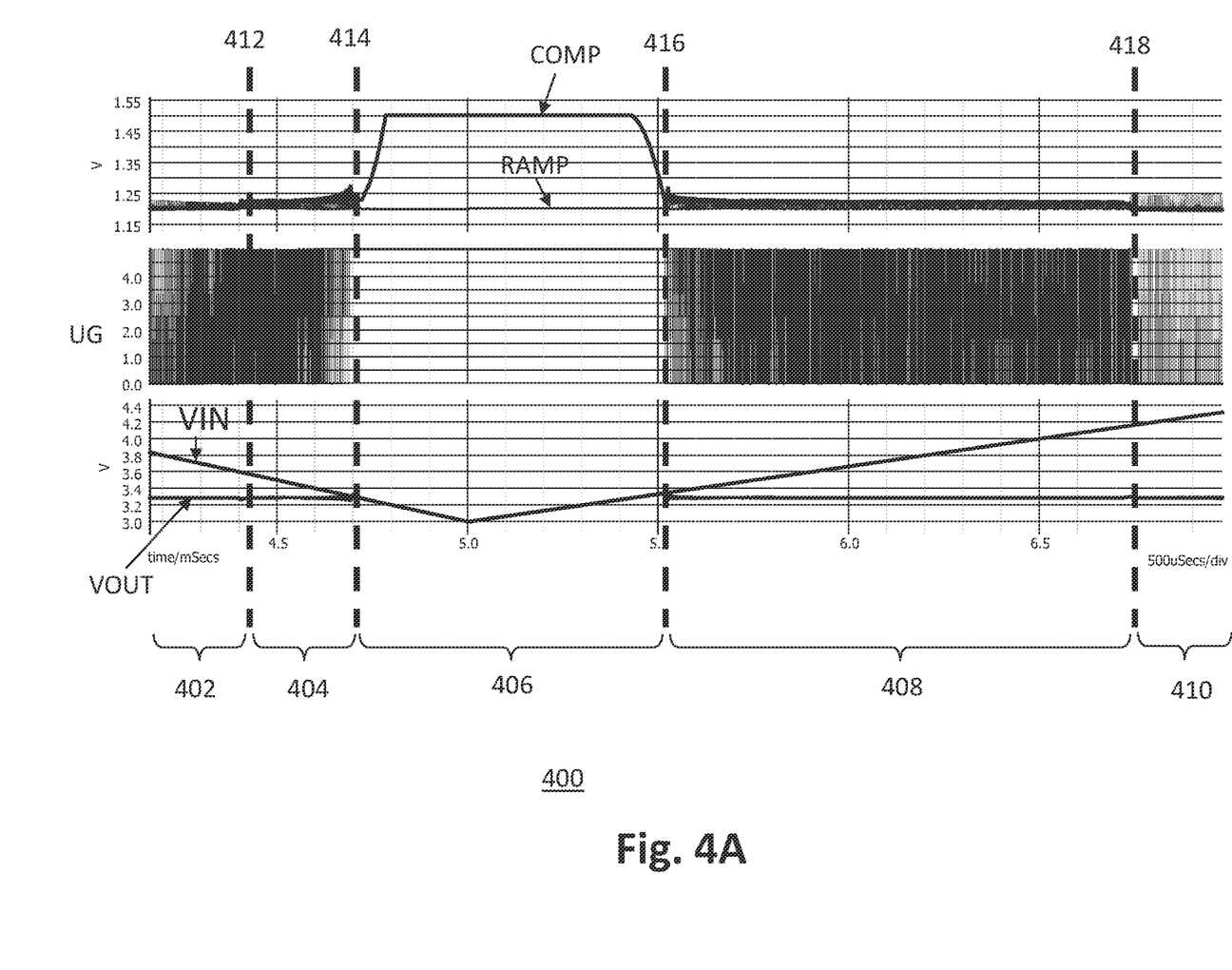
FIG. 4A is a diagram showing an example simulation result from an implementation of power converter in peak current mode constant off-time control in one embodiment.

FIG. 4A is a diagrams showing an example simulation result 400 from an example implementation of power converter in peak current mode constant off-time control in one embodiment. The example simulation result 400 is a result from an implementation where a specific amount of current is provided to the inductor (e.g., inductor L in FIG. 2B) of the power converter 101. In a period 402 shown in FIG. 4A, the power converter 101 can be operating under a constant on-time control in response to the COMP signal being less than the RAMP signal. In a period 404 shown in FIG. 4A, the power converter 101 can be operating under a constant off-time control in response to the RAMP signal being less than the COMP signal. As the COMP signal continues to increase from the period 404 to a period 406, the power converter 101 can reach 100% duty cycle in period 406. At period 408, the power converter 101 can continue to operate in constant off-time mode in response to the RAMP signal being less than the COMP signal. At period 410, the power converter 101 can return to operate in constant on-time mode in response to the COMP signal being less than the RAMP signal.

Figure 4B:
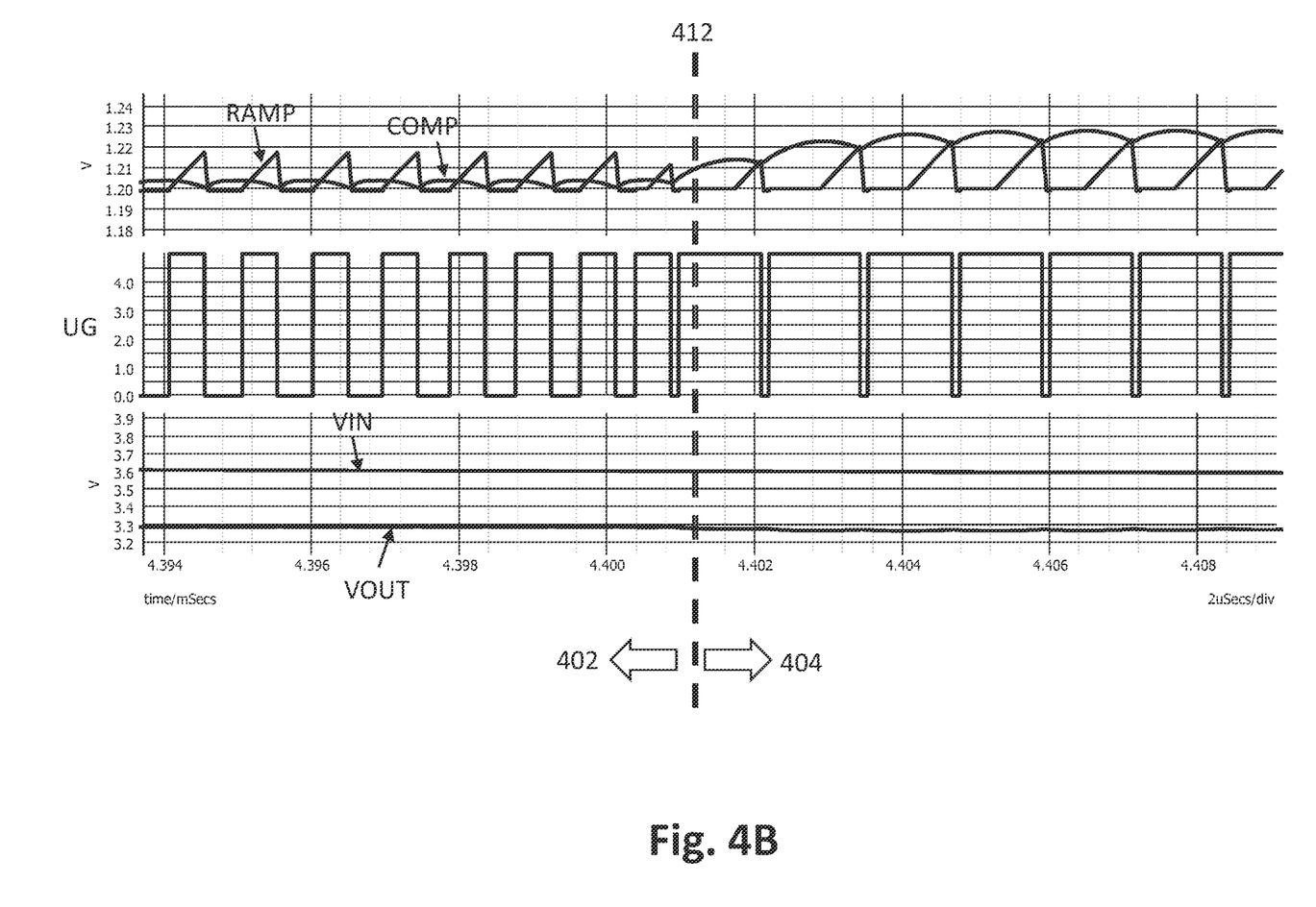
FIG. 4B is a diagram showing additional details of the example simulation result of FIG. 4A in one embodiment.
Figure 4C:
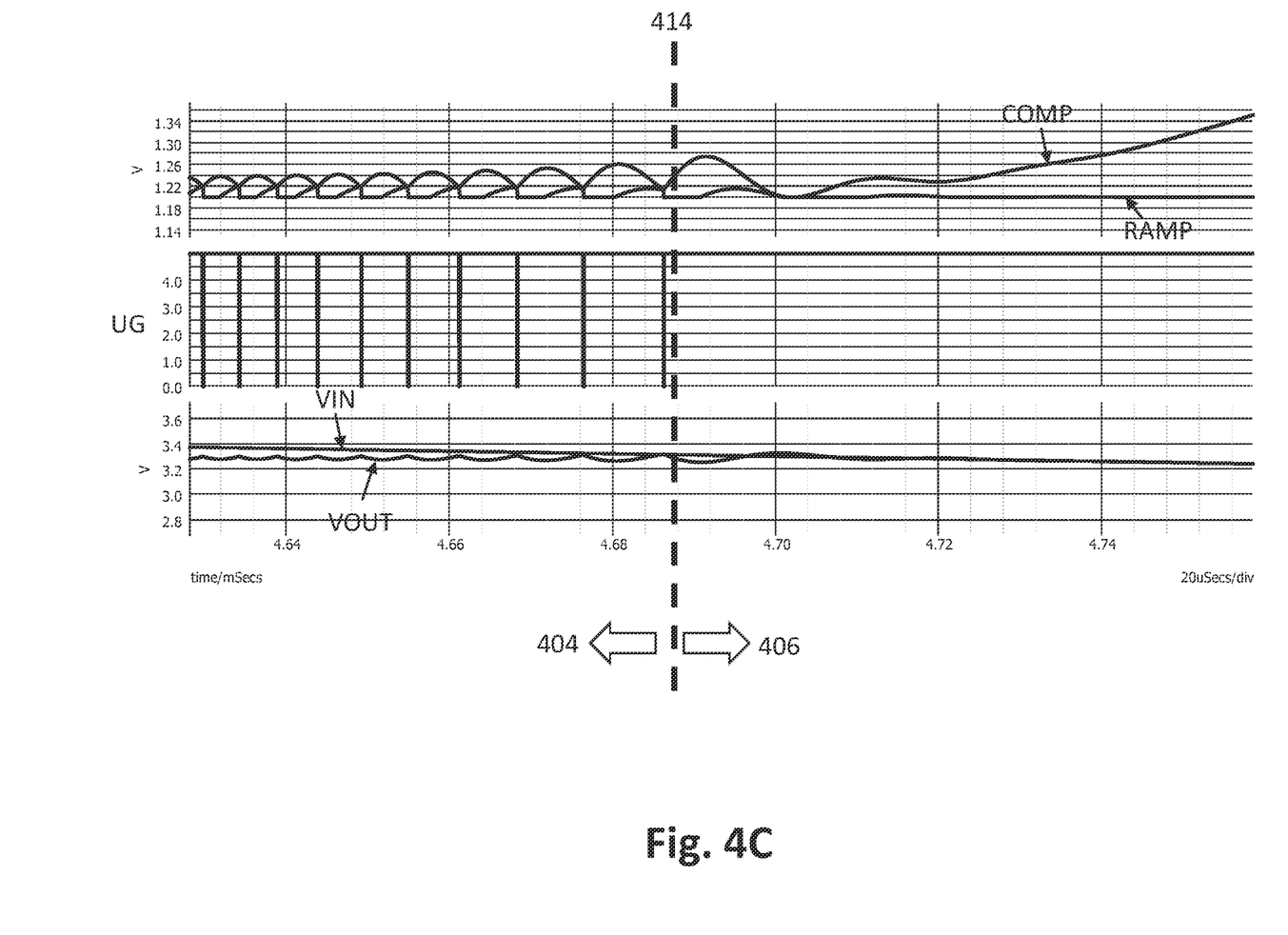
FIG. 4C is a diagram showing additional details of the example simulation result of FIG. 4A in one embodiment.
Figure 4D:
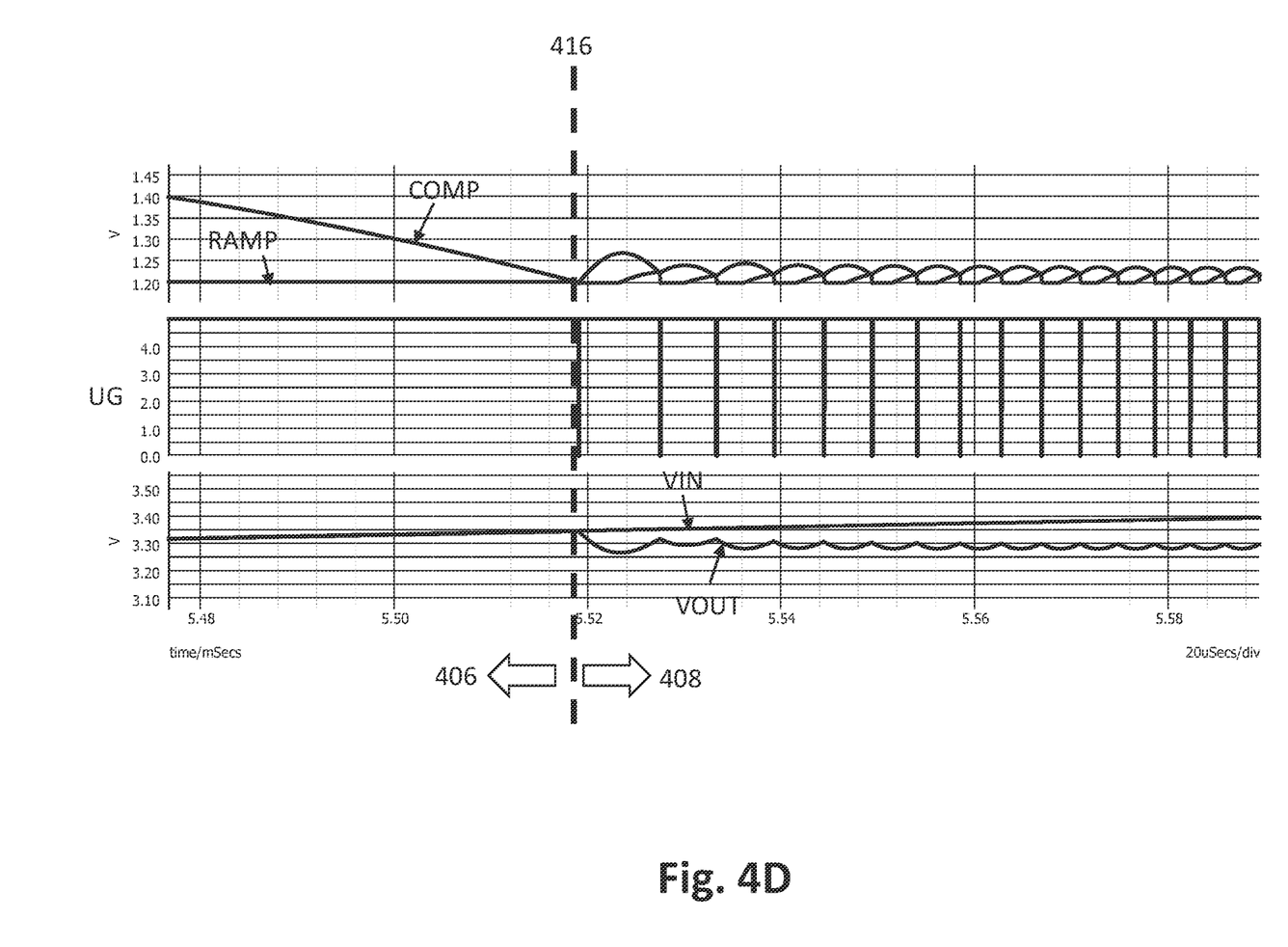
FIG. 4D is a diagram showing additional details of the example simulation result of FIG. 4A in one embodiment.
Figure 4E:
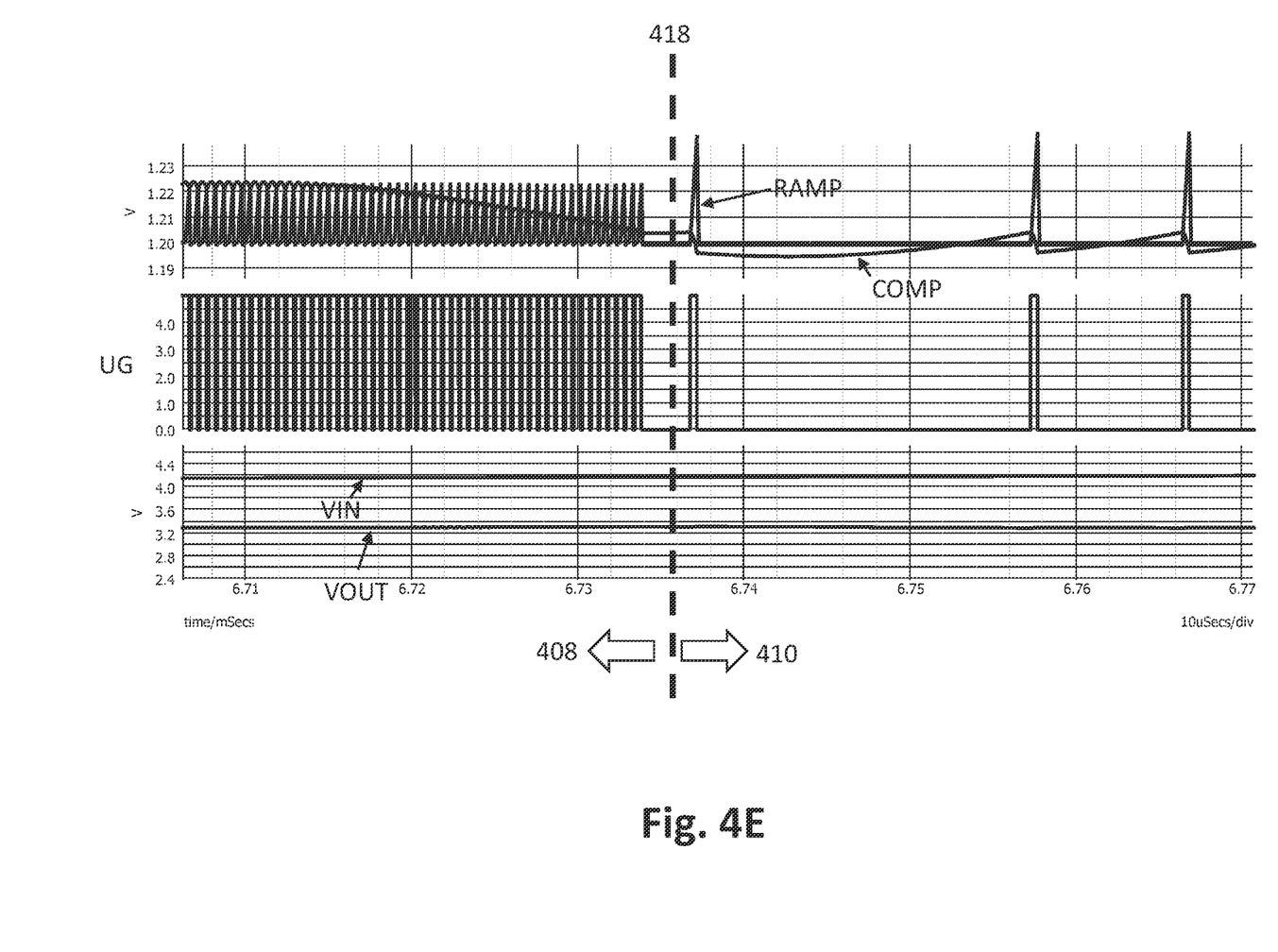
FIG. 4E is a diagram showing additional details of the example simulation result of FIG. 4A in one embodiment.

Different portions of the simulation result 400 are presented in detail in FIG. 4B to FIG. 4E. FIG. 4B shows details of a portion 412, FIG. 4C shows details of a portion 414, FIG. 4D shows details of a portion 416, and FIG. 4E shows details of a portion 418. In FIG. 4B, the COMP signal gradually becomes greater than the RAMP signal when transitioning from the period 402 to the period 404. As the COMP signal becomes greater than the RAMP signal, the on-time period or pulse width of the control signal UG increases as well. The controller 110 can exit the valley current control mode under constant on-time control and transition to peak current control mode under constant off-time control in the period 404. In FIG. 4C, the COMP signal remains greater than the RAMP signal in the period 404. In transitioning from the period 404 to the period 406, the on-time period of the control signal UG can reach a maximum in period 406, resulting in 100% duty cycle for the power converter 101. In FIG. 4D, the COMP signal remains greater than the RAMP signal in the period 406, but the COMP signal starts to decrease and causes the power converter 101 to exit 100% duty cycle operation. In the period 408, the on-time period of the control signal UG can start to decrease in response to the COMP signal being less than the RAMP signal on different occasions. The controller 110 can control the power converter 101 using the peak current control mode under constant off-time control as the power converter 101 exits the 100% duty cycle operation. In FIG. 4E, the COMP signal can become less than the RAMP signal in the period 410, and the controller 110 can control the power converter 101 using the valley current control mode under constant on-time control. Further, the power converter 101 can transition into pulse frequency modulation (PFM) operation with relatively long off time (e.g., indicated by the off-time of the control signal UG) in constant on-time control.

The methods, apparatus, and systems described herein can increase the duty cycle of a power converter by introducing a constant off-time control mode to control a switching element of the power converter. The increase in the duty cycle can address the issue of limited duty cycle caused by the minimum-off time implementation in conventional constant-on time control mode. Further, the methods, apparatus, and systems described herein can be implemented by an addition of relatively simple circuit that takes existing outputs as inputs to generate a constant off-time signal. For example, in the apparatus 100, the device 112 can be added to an existing power converter controller without altering existing components of the existing power converter controller. The device 112 can utilize the COMP and RAMP signals that are being generated by other components in the power converter controller (e.g., controller 110). Furthermore, by adding the device 112 to an existing controller, the transition between valley current control mode and peak current control mode can be performed smoothly. Still further, the apparatus described herein can use constant on-time control mode (e.g., when signal A controls the signal UG) or constant off-time control mode (e.g., when signal B controls the signal UG). In constant off-time control mode, the on-time period of the control signal UG can be increased to expand the duty cycle, and the on-time period can be increased to maximum duty cycle (e.g., 100% duty cycle).

The methods, apparatus, and systems described herein can provide a relatively simple and efficient implementation for a perfect buck regulator control scheme to achieve optimal output regulation with 0 to 100% duty cycle control capability. The scheme can rapidly and smoothly transit between constant on-time and constant off-time control, between constant off-time control and 100% duty cycle operation with infinity on time, and between nearly constant frequency pulse width modulation (PWM) and pulse frequency modulation (PFM) with an ability of infinite off-time in constant on time control. Also, the scheme can provide an optimal solution for battery powered devices to minimize the power loss at light or no load by lowering frequency in PFM mode and to fully utilize the battery power in over discharge low voltage condition by running at very large until 100% duty cycle condition.

Figure 5:
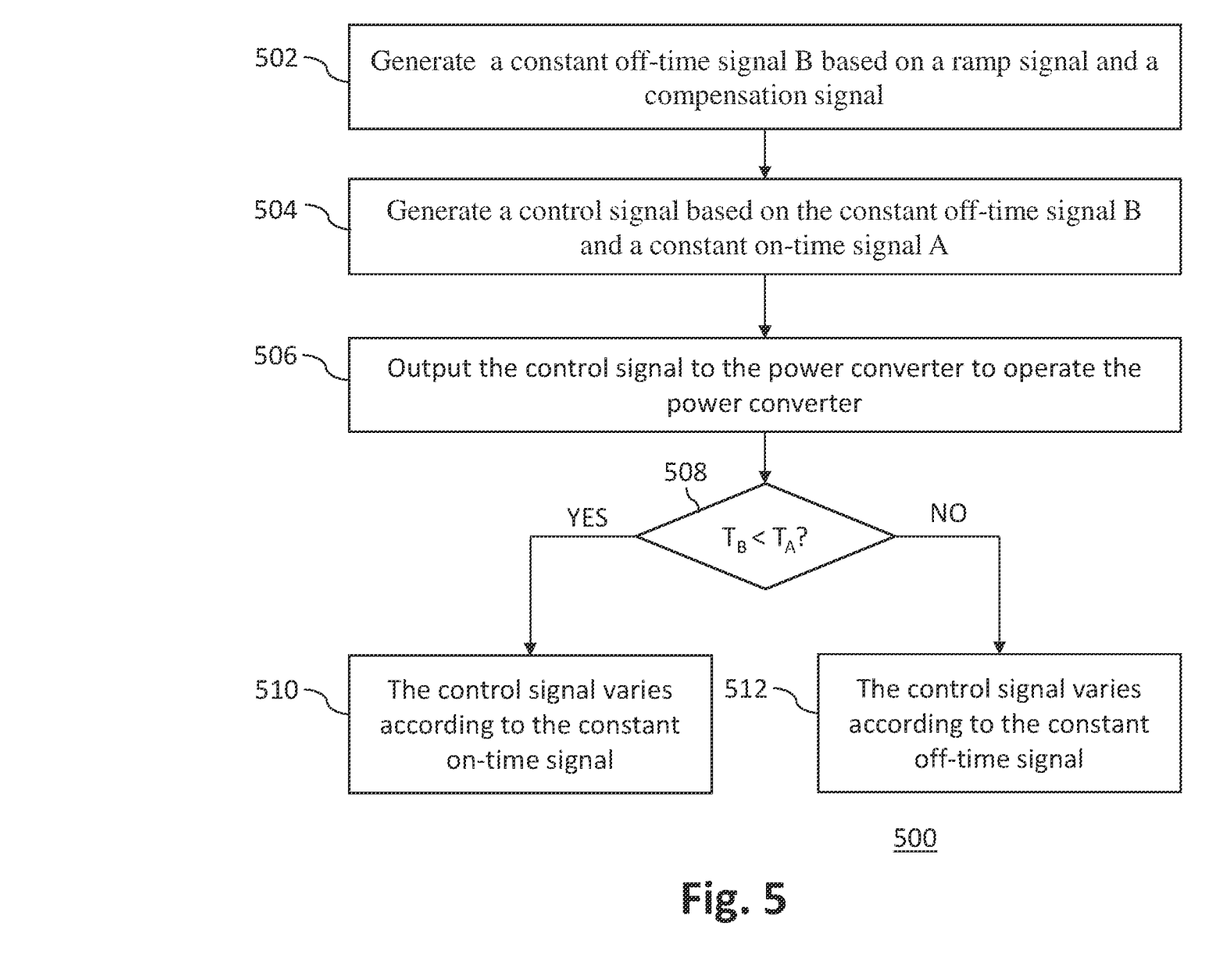
FIG. 5 is a flow diagram illustrating another process of implementing power converter in peak current mode constant off-time control in one embodiment.

FIG. 5 is a flow diagram illustrating a process 500 to implement extension card current monitor in one embodiment. The process 500 can include one or more operations, actions, or functions as illustrated by one or more of blocks 502, 504, 506, 508, 510 and/or 512. Although illustrated as discrete blocks, various blocks can be divided into additional blocks, combined into fewer blocks, eliminated, or performed in parallel, depending on the desired implementation.

The process 500 can begin at block 502. At block 502, a device can be integrated in a controller coupled to a power converter. The device can generate a constant off-time signal (signal B) based on a ramp signal and an error signal. The ramp signal can be sampled from an inductor current sensed from a power converter, and the error signal can be based on a feedback of an output the power converter.

The process 500 can proceed from block 502 to block 504. At block 504, the device can generate a control signal based on the constant off-time signal and a constant on-time signal (signal A). The ramp signal can be sampled from an inductor current sensed from a power converter, and the error signal can be based on a feedback of an output the power converter. In some examples, the power converter can be a buck converter. In some examples, the device can compare the ramp signal with the error signal to generate an off-time signal. The device can output the off-time signal to a SR latch to generate the constant off-time signal. The on-time signal can drive the constant off-time signal HIGH in response to the error signal being greater than the ramp signal.

The process 500 can proceed from block 504 to block 506. At block 506, the device can output the control signal to the power converter to operate the power converter. In an example, the device can perform a logical disjunction on the constant off-time signal and the constant on-time signal to generate the control signal. The device can output the control signal to a first switching element of the power converter, and can output the control signal to an inverter to invert the control signal. The device can output the inverted control signal to a second switching element of the power converter. In examples where the power converter is a buck converter, the device can output the control signal to an upper switching element of the buck converter, and can output an inverse of the control signal to a lower switching element of the buck converter.

The process 500 can proceed from block 506 to block 508. At block 508, the device can compare an on-time period $(T_B)$ of the constant off-time signal with an on-time period $(T_A)$ of the constant on-time signal. In response to $T_B$ being less than $T_A$, the process 500 can proceed from block 508 to block 510. At block 510, the control signal can vary according to the constant on-time signal. In response to $T_B$ being greater than $T_A$, the process 500 can proceed from block 508 to block 512. At block 512, the control signal can vary according to the constant off-time signal. A duty cycle of the power converter can increase in response to the control signal varying according to the constant off-time signal. The power converter can operate in a valley current mode in response to the control signal varying according to the constant on-time signal. The power converter can operate in a peak current control mode in response to the control signal varying according to the constant off-time signal.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device comprising:
a control circuit configured to generate a constant off-time signal based on a ramp signal and an error signal, the ramp signal is sampled from an inductor current sensed from a power converter, and the error signal is based on a feedback of an output of the power converter; and
a logic circuit coupled to the control circuit and the power converter, the logic circuit being configured to:
generate a control signal based on the constant off-time signal and a constant on-time signal, wherein:
in response to an on-time period of the constant off-time signal being less than an on-time period of the constant on-time signal, the control signal is generated to vary according to the constant on-time signal; and
in response to the on-time period of the constant off-time signal being greater than the on-time period of the constant on-time signal, the control signal is generated to vary according to the constant off-time signal; and
output the control signal to the power converter to operate the power converter.

2. The device of claim 1, wherein the logic circuit is configured to:
output the control signal to the power converter to operate the power converter in a valley current mode in response to the control signal varying according to the constant on-time signal; and
output the control signal to the power converter to operate the power converter in a peak current mode in response to the control signal varying according to the constant off-time signal.

3. The device of claim 1, wherein:
the control circuit comprises a comparator and a SR latch coupled to the comparator;
the comparator being configured to:
compare the ramp signal with the error signal to generate an off-time signal; and
output the off-time signal to the SR latch; and
the SR latch being configured to:
receive an on-time signal as a first input;
receive the off-time signal as a second input; and
output the constant off-time signal, wherein the on-time signal drives the constant off-time signal HIGH in response to the error signal being greater than the ramp signal.

4. The device of claim 1, wherein:
the logic circuit comprises an OR gate and an inverter coupled to the OR gate;
the OR gate being configured to:
perform a logical disjunction on the constant off-time signal and the constant on-time signal to generate the control signal;
output the control signal to a first switching element of the power converter; and
output the control signal to the inverter; and
the inverter being configured to:
invert the control signal; and
output the inverted control signal to a second switching element of the power converter.

5. The device of claim 1, wherein the power converter is a buck converter.

6. The device of claim 5, wherein the logic circuit is further configured to:
output the control signal to an upper switching element of the buck converter; and
output an inverse of the control signal to a lower switching element of the buck converter.

7. The device of claim 1, wherein the logic circuit is configured to output the control signal, that is generated to vary according to the constant off-time signal, to the power converter to increase a duty cycle of the power converter.

8. An apparatus comprising:
a power converter;
a controller coupled to the power converter, the controller being configured to:
generate a constant off-time signal based on a ramp signal and an error signal, the ramp signal is sampled from an inductor current sensed from the power converter, and the error signal is based on a feedback of an output of the power converter;

generate a control signal based on the constant off-time signal and a constant on-time signal, wherein:

in response to an on-time period of the constant off-time signal being less than an on-time period of the constant on-time signal, the control signal is generated to vary according to the constant on-time signal; and in response to the on-time period of the constant off-time signal being greater than the on-time period of the constant on-time signal, the control signal is generated to vary according to the constant off-time signal; and output the control signal to the power converter to operate the power converter.

9. The apparatus of claim 8, wherein the controller is configured to:

output the control signal to the power converter to operate the power converter in a valley current mode in response to the control signal varying according to the constant on-time signal; and output the control signal to the power converter to operate the power converter in a peak current mode in response to the control signal varying according to the constant off-time signal.

10. The apparatus of claim 8, wherein:

the controller comprises a control circuit;

the control circuit comprises a comparator and a SR latch coupled to the comparator;

the comparator being configured to:

compare the ramp signal with the error signal to generate an off-time signal; and output the off-time signal to the SR latch; and the SR latch being configured to:

receive an on-time signal as a first input;

receive the off-time signal as a second input; and output the constant off-time signal, wherein the on-time signal drives the constant off-time signal HIGH in response to the error signal being greater than the ramp signal.

11. The apparatus of claim 8, wherein:

the controller comprises a logic circuit;

the logic circuit comprises an OR gate and an inverter coupled to the OR gate;

the OR gate being configured to:

perform a logical disjunction on the constant off-time signal and the constant on-time signal to generate the control signal;

output the control signal to a first switching element of the power converter; and output the control signal to the inverter; and the inverter being configured to:

invert the control signal; and output the inverted control signal to a second switching element of the power converter.

12. The apparatus of claim 8, wherein the power converter is a buck converter.

13. The apparatus of claim 12, wherein the controller is configured to:

output the control signal to an upper switching element of the buck converter; and output an inverse of the control signal to a lower switching element of the buck converter.

14. The apparatus of claim 8, wherein the controller is configured to output the control signal, that is generated to vary according to the constant off-time signal, to the power converter to increase a duty cycle of the power converter.

15. A method comprising:

generating a constant off-time signal based on a ramp signal and an error signal, the ramp signal is sampled from an inductor current sensed from a power converter, and the error signal is based on a feedback of an output the power converter;

generating a control signal based on the constant off-time signal and a constant on-time signal, wherein:

in response to an on-time period of the constant off-time signal being less than an on-time period of the constant on-time signal, the control signal is generated to vary according to the constant on-time signal; and in response to the on-time period of the constant off-time signal being greater than the on-time period of the constant on-time signal, the control signal is generated to vary according to the constant off-time signal; and outputting the control signal to the power converter to operate the power converter.

16. The method of claim 15, comprising:

outputting the control signal to the power converter to operate the power converter in a valley current mode in response to the control signal varying according to the constant on-time signal; and outputting the control signal to the power converter to operate the power converter in a peak current mode in response to the control signal varying according to the constant off-time signal.

17. The method of claim 15, further comprising:

comparing the ramp signal with the error signal to generate an off-time signal; and outputting the off-time signal to a SR latch to output the constant off-time signal, wherein the on-time signal drives the constant off-time signal HIGH in response to the error signal being greater than the ramp signal.

18. The method of claim 15, further comprising:

performing a logical disjunction on the constant off-time signal and the constant on-time signal to generate the control signal;

outputting the control signal to a first switching element of the power converter;

outputting the control signal to an inverter to invert the control signal; and outputting the inverted control signal to a second switching element of the power converter.

19. The method of claim 15, wherein the power converter is a buck converter.

20. The method of claim 19, further comprising:

outputting the control signal to an upper switching element of the buck converter; and outputting an inverse of the control signal to a lower switching element of the buck converter.

* * * * *